United States Patent
Chiu et al.

(10) Patent No.: US 8,095,101 B2
(45) Date of Patent: Jan. 10, 2012

(54) RECEIVING DEVICE AND RELATED METHOD FOR CALIBRATING DC OFFSET

(75) Inventors: Pei-Ju Chiu, Taichung County (TW); Chia-Jun Chang, Taipei (TW); Chao-Cheng Lee, Hsin-Chu (TW)

(73) Assignee: Realtek Semiconductor Corp., Science Park, HsinChu (TW)

(*) Notice: Subject to any disclaimer, the term of this patent is extended or adjusted under 35 U.S.C. 154(b) by 953 days.

(21) Appl. No.: 12/060,849

(22) Filed: Apr. 1, 2008

(65) Prior Publication Data

US 2008/0238538 A1    Oct. 2, 2008

(30) Foreign Application Priority Data

Apr. 2, 2007 (TW) ................ 96111673 A

(51) Int. Cl.
H04B 1/06 (2006.01)
H04B 7/00 (2006.01)
H04B 1/28 (2006.01)

(52) U.S. Cl. ............... 455/232.1; 455/240.1; 455/248.1; 455/244.1; 455/250.1

(58) Field of Classification Search .................. 455/284, 455/307, 296, 334, 195.1, 194.1, 181.1, 232.1, 455/244.1, 228.1, 250.1, 283, 278.1, 280, 455/130, 63.1, 295, 136, 138, 240.1, 3; 327/307, 327/594, 552, 553, 559; 375/332, 326, 345, 375/349

See application file for complete search history.

(56) References Cited

U.S. PATENT DOCUMENTS

| | | | |
|---|---|---|---|
| 5,724,653 A | 3/1998 | Baker | |
| 5,764,103 A | 6/1998 | Burra | |
| 6,560,447 B2* | 5/2003 | Rahman et al. | 455/232.1 |
| 6,690,225 B2* | 2/2004 | Kondo et al. | 327/307 |
| 6,771,945 B1* | 8/2004 | Pickett et al. | 455/324 |
| 7,020,449 B2* | 3/2006 | Shi | 455/234.1 |
| 7,295,820 B2* | 11/2007 | Shafeeu | 455/136 |
| 7,403,760 B1* | 7/2008 | Gao | 455/312 |
| 7,693,242 B2* | 4/2010 | Sobchak et al. | 375/349 |
| 7,760,824 B2* | 7/2010 | Kim et al. | 375/345 |
| 7,933,575 B2* | 4/2011 | Chung et al. | 455/307 |
| 2003/0174783 A1 | 9/2003 | Rahman | |
| 2003/0214423 A1 | 11/2003 | Lee | |
| 2004/0106380 A1 | 6/2004 | Vassiliou et al. | |
| 2005/0020226 A1 | 1/2005 | Mohindra | |
| 2007/0177692 A1* | 8/2007 | Payne | 375/326 |
| 2009/0093228 A1* | 4/2009 | Rostami et al. | 455/284 |
| 2011/0037506 A1* | 2/2011 | Kalakota et al. | 327/307 |

FOREIGN PATENT DOCUMENTS

TW    I268049    12/2006

* cited by examiner

Primary Examiner — Pablo Tran

(74) Attorney, Agent, or Firm — Winston Hsu; Scott Margo

(57) ABSTRACT

A receiving device includes a mixer, an AC coupling circuit, a post-stage circuit, and a DC offset calibration circuit. The mixer is utilized for mixing an input signal with a local oscillating (LO) signal from an oscillator to generate a converted signal. The AC coupling circuit is coupled to the mixer and utilized for reducing at least one portion of DC offset of the converted signal to generate a filtered signal. The post-stage circuit is coupled to the AC coupling circuit and utilized for processing the filtered signal to generate an output signal. The DC offset calibration circuit is coupled to the post-stage circuit and utilized for providing at least a compensation current for the post-stage circuit to reduce DC offset of the output signal.

18 Claims, 4 Drawing Sheets

RECEIVING DEVICE AND RELATED METHOD FOR CALIBRATING DC OFFSET

BACKGROUND OF THE INVENTION

1. Field of the Invention

The present invention relates to a communication system, and more particularly, to a receiving apparatus in a communication system and related method.

2. Description of the Prior Art

A conventional DC offset calibration scheme applied in a receiving system usually adopts an AC coupling to filter out the DC offset in a signal or performs a current compensation to calibrate the DC offset in the signal. However, since a conventional AC coupling need enough response time (also called frequency response time) to correctly operate, the total response time of the receiving system will become much longer if an AC coupling is applied in each amplifying circuit or each filtering circuit to filter out DC offset of the signal in the signal.

On the other hand, if a current compensation operation is used for calibrating the DC offset in the signal, it is not only required to wait for a predetermined period to determine a current amount for compensation, but also consumes more power than the AC coupling since it utilizes the current amount for compensation. Furthermore, a determined compensation current is easily affected by changes in operating temperature and/or operating voltage. Practically, it is very difficult to predict any randomized DC offset caused by self-mixing in a mixer, local oscillator (LO) leakage, or other noise in front-circuit of the receiving system. Thus, the current compensation operation cannot accurately calibrate the DC offset in the above-described signal. That is, even though the current compensation circuit can calibrate the DC offset caused by transistor mismatch from amplifying circuits or filtering circuits in the receiving system, it cannot accurately calibrate the DC offset caused by the self-mixing in the mixer, the LO leakage, or other noise.

SUMMARY OF THE INVENTION

It is therefore one of the objectives of the present invention to provide a receiving device and related method capable of calibrating DC offset caused by transistor mismatch.

Another objective of the present invention is provide a receiving device and related method capable of calibrating DC offset caused by self-mixing in a mixer, LO leakage, or other signal noise.

Another objective of the present invention is to further provide a receiving device having a shorter system startup time and method thereof.

According to an embodiment of the present invention, a receiving device is disclosed. The receiving device comprises a mixer, an AC coupling circuit, a post-stage circuit, and a DC offset calibration circuit. The mixer is utilized for mixing an input signal with a local oscillating (LO) signal from an oscillator to generate a converted signal. The AC coupling circuit is coupled to the mixer and utilized for reducing at least one portion of DC offset of the converted signal to generate a filtered signal. The post-stage circuit is coupled to the AC coupling circuit and utilized for processing the filtered signal to generate an output signal. The DC offset calibration circuit is coupled to the post-stage circuit and utilized for providing at least a compensation current for the post-stage circuit to reduce DC offset of the output signal.

According to an embodiment of the present invention, a receiving method is disclosed. The receiving method comprises the following steps of: mixing an input signal with a local oscillation signal from an oscillator to generate a mixed signal; performing an AC coupling operation upon the mixed signal to reducing at least one portion of DC offset of the mixed signal to generate a filtered signal; providing a post-stage circuit for processing the filtered signal to generate an output signal; and providing at least a compensation current for the post-stage circuit to reduce DC offset in the output signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
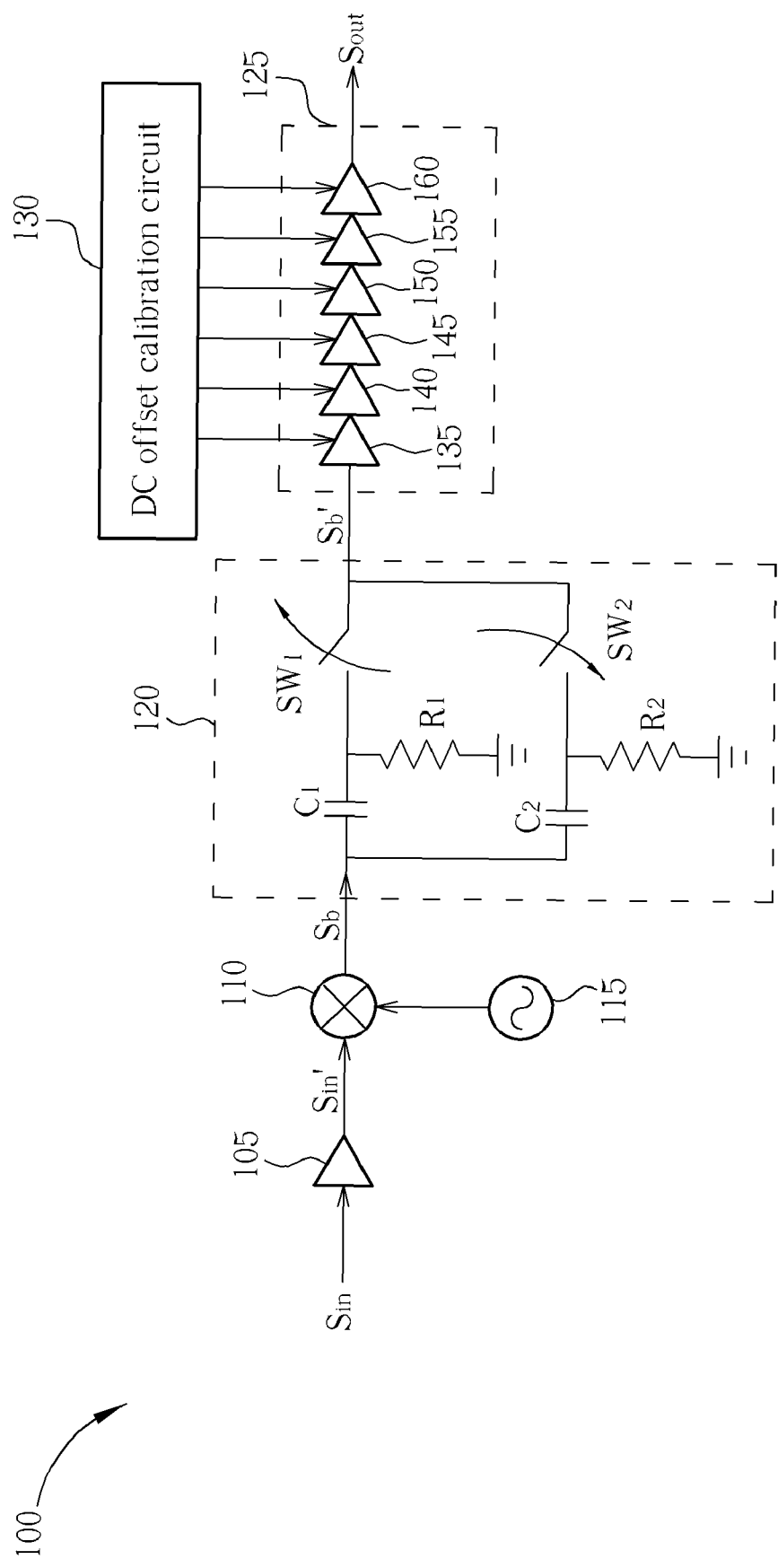
FIG. 1 is a diagram of a receiving device according to an embodiment of the present invention.

Please refer to FIG. 1. FIG. 1 is a diagram of a receiving device 100 according to an embodiment of the present invention. The receiving device 100 includes a low noise amplifier (LNA) 105, a mixer 110, a local oscillator 115, an AC coupling circuit 120, a post-stage circuit 125, and a DC offset calibration circuit 130. The LNA 105 is utilized for amplifying a radio-frequency signal $S_{in}$ from an antenna (not shown in FIG. 1) to generate a radio-frequency signal $S_{in}'$. The mixer 110 is utilized for performing a direct down-conversion operation upon the radio-frequency signal $S_{in}'$ to generate a down-converted signal $S_b$ according to an oscillator frequency output by the local oscillator 115. The AC coupling circuit 120 is utilized for performing an AC coupling operation upon the down-converted signal $S_b$ to generate a coupled down-converted signal $S_b'$. The post-stage circuit 125 is utilized for receiving the coupled down-converted signal $S_b'$ to generate an output signal $S_{out}$ into a back-end baseband circuit (not shown in FIG. 1). It should be noted that an objective of the AC coupling circuit 120 is to reduce DC offset arising in the down-converted signal $S_b$, which is caused by self-mixing in the mixer 110, LO leakage from the local oscillator 115, and other signal noise. In this embodiment, the AC coupling circuit 120 is comprised of two capacitors $C_1$ and $C_2$, two resistors $R_1$ and $R_2$, and two switches $SW_1$ and $SW_2$. The capacitor $C_1$ and resistor $R_1$ or the capacitor $C_2$ and resistor $R_2$ are equivalently regarded as high pass filters. Even though it is very hard to predict the DC offset caused by the above-mentioned self-mixing, the LO leakage, or other signal noise, the AC coupling circuit 120 can filter out low frequency components in the down-converted signal $S_b$ such that the level of the coupled down-converted $S_b'$ falls within an acceptable signal range for the post-stage circuit 125 if either one of the switches $SW_1$ and $SW_2$ is closed. The low frequency components in the down-converted signal $S_b$ effectively form the DC offset caused by the self-mixing in the mixer 110, the LO leakage from the local oscillator 115, or other signal noise.

In addition, the response time (i.e. the frequency response time) of a resistor-capacitor circuit depends on a time constant of this circuit itself. If the time constant is larger, then the required response time is longer. Accordingly, if the time constant of the AC coupling circuit 120 is larger, a required total response time of the receiving device 100 is influenced and becomes longer. For example, if the AC coupling circuit 120 has a larger time constant, the required power-on time (in initial mode) of the receiving device 100 will be longer. In order to solve the problem, the AC coupling circuit 120 utilizes two resistor-capacitor circuits having different time constants and dynamically switches from one circuit to another so that the power-on time of the receiving device 100 can be shortened. In this embodiment, it is assumed that a time constant generated by the resistor $R_1$ and capacitor $C_1$ is larger than that generated by the resistor $R_2$ and capacitor $C_2$. When the receiving device 100 is started, the switch $SW_1$ and the switch $SW_2$ is open and closed respectively according to a selecting signal from a selecting circuit (not shown). The response time of the AC coupling circuit 120 becomes shorter and therefore the total boot time of the receiving device 100 does not become longer. On the other hand, the AC coupling circuit 120 having a smaller time constant also means the AC coupling circuit 120 has a higher corner frequency (also called a cutoff frequency or a 3 dB frequency). In order to avoid distortions arising in the coupled down-converted signal $S_b'$ due to the higher corner frequency (i.e. to prevent the higher corner frequency from affecting the linearity of the coupled down-converted signal $S_b'$), the switch $SW_1$ is closed but the switch $SW_2$ is open after a startup process of the receiving device 100 is finished. Since the AC coupling circuit 120 has a lower corner frequency in this moment, no distortion is introduced in the coupled down-converted signal $S_b'$.

Additionally, although the AC coupling circuit 120 can be utilized for filtering out the DC offset arising in the down-converted signal $S_b$, there is a possibility that some DC offset still exists in the output signal $S_{out}$ due to transistor mismatch in the post-stage circuit 125, such as in the operational amplifiers. In this embodiment, the post-stage circuit 125 includes multiple filters and gain amplifiers. For instance, the post-stage circuit 125 includes two low-pass filters (LPF) 135 and 140 and four programmable gain amplifiers (PGA) 145, 150, 155, and 160. Thus, the DC offset calibration circuit 130 is for providing at least a specific compensation current for the post-stage circuit 125 to calibrate the DC offset in the output signal $S_{out}$ through a current compensation operation. For example, since the LPFs 135 and 140 and the PGAs 145, 150, 155, and 160 themselves have differential circuits respectively, the DC offset calibration circuit 130 can provide a specific compensation current for each differential circuit to separately calibrate any DC offset caused by transistor mismatch from the differential circuits. In this way, calibrating the DC offset in the output signal $S_{out}$ is finally achieved. In practice, the DC offset calibration circuit 130 has multiple comparators that are used for separately comparing voltage levels at two output terminals of each differential circuit. The DC offset calibration circuit 130 utilizes the result of multiple comparators to determine whether the specific compensation current should be provided to the output terminal having a lower voltage level in order to raise it to be substantially the same as the higher voltage level. Consequently, reducing DC offset in the signal $S_{out}$ caused by component (ex: transistor) mismatch in the post-stage circuit 125 can be achieved by the current compensation operation of the DC offset calibration circuit 130.

Figure 2:
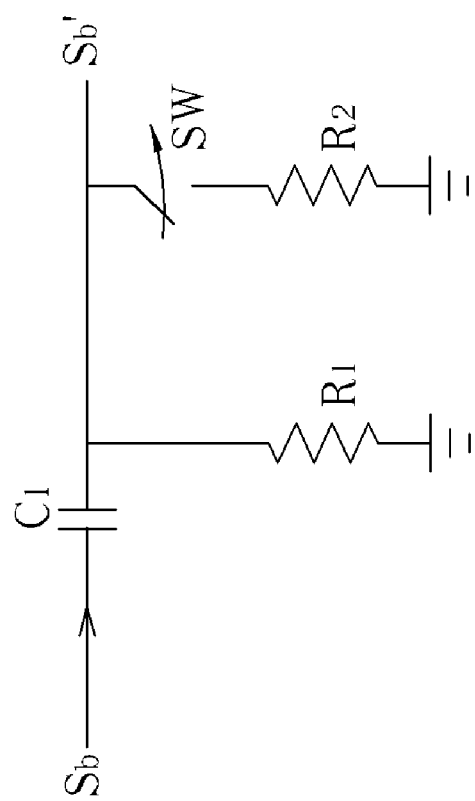
FIG. 2 is a diagram of an AC coupling circuit according to another embodiment of the present invention.

It should be noted that the LPFs and PGAs shown in FIG. 1 are an example for illustrating circuit components, which include differential circuits, in the post-stage circuit 125; the number of the LPFs or PGAs is not meant to be a limitation of the present invention. Additionally, through the teachings of the present invention, those skilled in this art can also design other modifications for the AC coupling circuit 120. Therefore, any modification having substantially the same AC coupling operation also obeys the spirit of the present invention. For instance, the AC coupling circuit 120 can be replaced by an AC coupling circuit, which has only one resistor-capacitor circuit. This can also achieve the goal of reducing the DC offset in the down-converted signal $S_b$, which is caused by self-mixing in the mixer 110, the LO leakage, or other noise. Another modification having a time constant switch operation similar to the operation of using two resistor-capacitor circuits having different time constants also falls within the scope of the present invention. Please refer to FIG. 2. FIG. 2 is a diagram of an AC coupling circuit 220 according to another embodiment of the present invention. In this embodiment, suppose that the resistance value of the resistor $R_2$ is smaller than that of the resistor $R_1$. The switch SW is closed when the receiving device 100 is started; the switch SW will become open after the startup process of the receiving device 100 is finished. Accordingly, when the receiving device 100 is started, the total response time of the receiving device 100 is not lengthened since a resistor-capacitor circuit within the AC coupling circuit 220 has a smaller time constant, which is equal to $$C \times \frac{R_1 \times R_2}{R_1 + R_2}.$$

Subsequently, when receiving the down-converted signal $S_b$ in the beginning after the startup process is finished, no distortion will be introduced in the coupled down-converted signal $S_b'$ since the AC coupling circuit 220 has a larger time constant, which is equal to $C \times R_1$.

Figure 3:
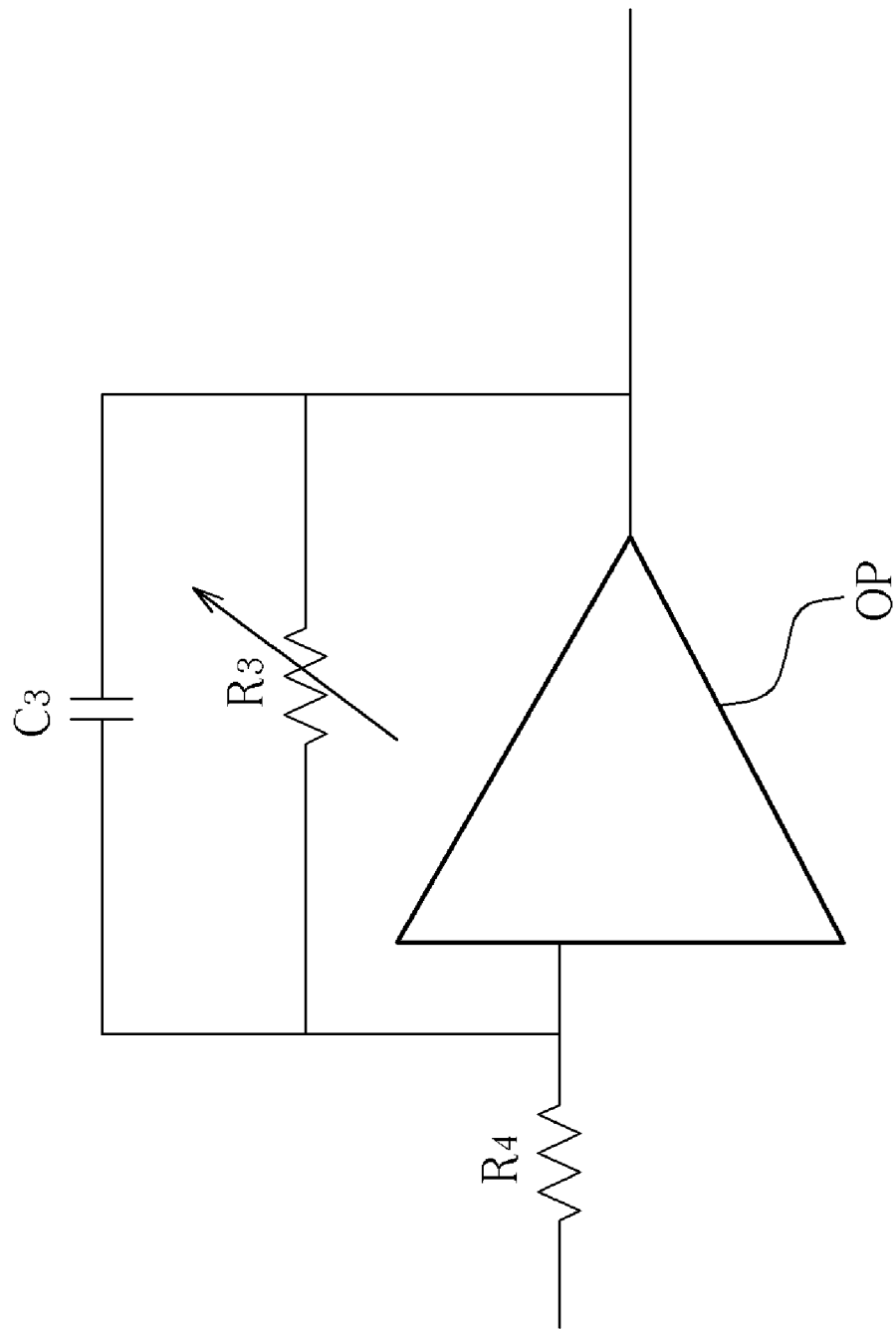
FIG. 3 illustrates a diagram of low-pass filter (LPF) of the post-stage circuit in FIG. 1.
Figure 4:
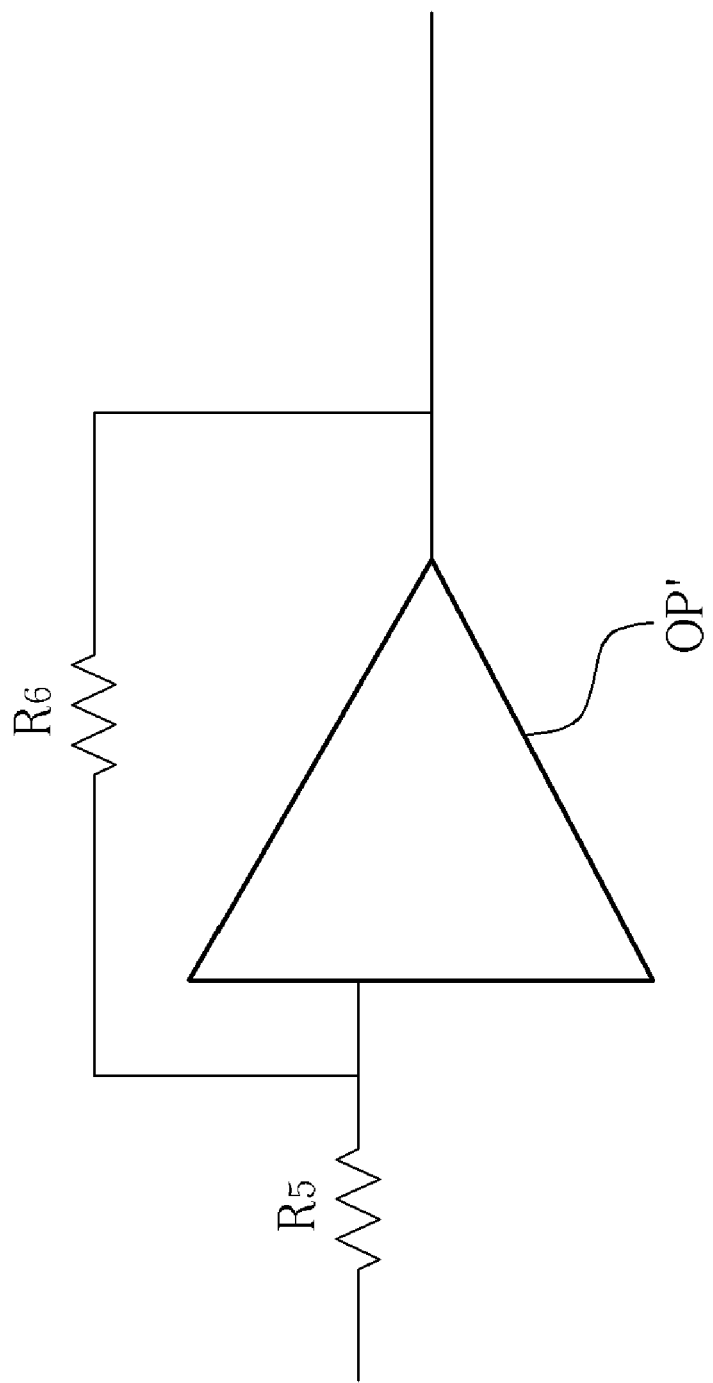
FIG. 4 illustrates a diagram of a programmable gain amplifier (PGA) of the post-stage circuit in FIG. 1.

FIG. 3 illustrates a diagram of a low-pass filter (LPF) of the post-stage circuit 125 in FIG. 1. In the FIG. 3, the low-pass filter, e.g. 135, comprises an operational amplifier OP, two resistors $R_3$ and $R_4$, and a capacitor $C_3$. At least one of two resistors $R_3$ and $R_4$ and the capacitor $C_3$ is adjustable. FIG. 4 illustrates a diagram of a programmable gain amplifier (PGA) of the post-stage circuit 125 in FIG. 1. In the FIG. 4, the programmable gain amplifier (PGA), e.g. 145, comprises an operational amplifier OP' and at least two resistors $R_5$ and $R_6$. At least one of two resistors $R_5$ and $R_6$ is adjustable.

In an embodiment, the DC-offset calibration circuit 130 can be a plurality of DAC (digital-to-analog converter) for generating a corresponding compensation current for the LPFs and PGAs of the post-stage circuit 125 according to a corresponding digital signal. Furthermore, due to the AC coupling 120 reduces a portion of DC offset of output signal $S_{out}$, an amount of the compensation current of the DC-offset calibration circuit 130 is smaller than that of the conventional current compensation method. That is, the conventional current compensation method consumes more power than the embodiment of the present invention.

Those skilled in the art will readily observe that numerous modifications and alterations of the device and method may be made while retaining the teachings of the invention.

What is claimed is:
1. A receiving device, comprising:
a mixer, for mixing an input signal with a local oscillating (LO) signal from an oscillator to generate a converted signal;

an AC coupling circuit, coupled to the mixer, for reducing at least one portion of DC offset of the converted signal to generate a filtered signal;

a post-stage circuit, coupled to the AC coupling circuit, for processing the filtered signal to generate an output signal; and a DC offset calibration circuit, coupled to the post-stage circuit, for providing at least a compensation current for the post-stage circuit to reduce DC offset of the output signal;

wherein the AC coupling circuit is utilized to perform high pass filtering upon the converted signal to filter out a low-frequency component in the converted signal so as to reduce the portion of the DC offset.

2. The device of claim 1, wherein the at least one portion DC offset is caused by at least one of a self-mixing of the mixer, a leakage of the oscillator.

3. The device of claim 1, wherein the AC coupling circuit includes a first configuration and a second configuration, wherein the AC coupling circuit having a first time constant in the first configuration, and the AC coupling circuit having a second time constant in the second configuration.

4. The device of claim 3, wherein the AC coupling circuit further comprises:
a determining circuit, for determining the AC coupling circuit to operate at the first configuration during an initial state.

5. The device of claim 1, wherein the DC offset of the output signal is caused by transistor mismatch of the post-stage circuit.

6. The device of claim 1, wherein the post-stage circuit comprises a low-pass filter and a programmable gain circuit.

7. The device of claim 1, wherein the post-stage circuit comprises a low-pass filter comprising: an operational amplifier, a resistor, and a capacitor.

8. The device of claim 1, wherein the post-stage circuit comprises programmable gain circuit comprising: an operational amplifier, at least two resistors.

9. A receiving method, comprising:
mixing an input signal with a local oscillation signal from an oscillator to generate a mixed signal;
performing an AC coupling operation upon the mixed signal to reducing at least one portion of DC offset of the mixed signal to generate a filtered signal;
providing a post-stage circuit for processing the filtered signal to generate an output signal; and
providing at least a compensation current for the post-stage circuit to reduce DC offset in the output signal;
wherein the step of performing the AC coupling operation is utilized to perform high pass filtering upon the converted signal to filter out a low-frequency component in the converted signal so as to reduce the portion of the DC offset.

10. The receiving method of claim 9, wherein the at least one portion of DC offset of the mixed signal caused by a self-mixing of a mixer.

11. The receiving method of claim 9, wherein the at least one portion of DC offset of the mixed signal caused by a leakage of the oscillator.

12. The receiving method of claim 9, wherein the DC offset of the output signal is caused by transistor mismatch of the post-stage circuit.

13. The receiving method of claim 9, wherein the step of performing the AC coupling operation further comprises:
performing the AC coupling operation at either the first configuration or the second configuration;
wherein the first configuration and the second configuration corresponds to a first time constant and a second time constant respectively.

14. The receiving method of claim 13, wherein performing the AC coupling operation at the second configuration during an initial state.

15. The receiving method of claim 9, wherein the step of processing the filtered signal further comprises:
filtering and gain-adjusting the filtered signal to generate the output signal.

16. The device of claim 3, wherein the second time constant is smaller than the first time constant, and the AC coupling circuit operates at the second configuration when the receiving device boots up, to reduce a total boot time of the receiving device.

17. The receiving method of claim 13, wherein the second time constant is smaller than the first time constant, and the step of performing the AC coupling operation comprises:
performing the AC coupling operation at the second configuration during initialization, to reduce a total boot time.

18. A receiving device, comprising:
a mixer, for mixing an input signal with a local oscillating (LO) signal from an oscillator to generate a converted signal;
an AC coupling circuit, coupled to the mixer, for reducing at least one portion of DC offset of the converted signal to generate a filtered signal;
a post-stage circuit, coupled to the AC coupling circuit, for processing the filtered signal to generate an output signal, and the post-stage circuit comprises:
at least one low-pass filter; and
at least one programmable gain amplifier, coupled to the at least one low-pass filter;
a DC offset calibration circuit, coupled to the post-stage circuit, for providing at least a compensation current for the post-stage circuit to reduce DC offset of the output signal.

* * * * *